(12) United States Patent
Ooya et al.

(10) Patent No.: US 8,642,478 B2
(45) Date of Patent: Feb. 4, 2014

(54) PLASMA PROCESSING METHOD AND PLASMA PROCESSING APPARATUS

(75) Inventors: Yoshinobu Ooya, Nirasaki (JP); Akira Tanabe, Nirasaki (JP); Yoshinori Yasuta, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 184 days.

(21) Appl. No.: 13/214,372

(22) Filed: Aug. 22, 2011

(65) Prior Publication Data

US 2012/0214313 A1    Aug. 23, 2012

Related U.S. Application Data

(60) Provisional application No. 61/382,552, filed on Sep. 14, 2010.

(30) Foreign Application Priority Data

Aug. 23, 2010   (JP) .................................. 2010-186017
Aug. 4, 2011    (JP) .................................. 2011-171005

(51) Int. Cl.
*H01L 21/302*    (2006.01)
*H01L 21/461*    (2006.01)

(52) U.S. Cl.
USPC ........... 438/706; 438/707; 438/708; 438/709; 438/710; 438/723

(58) Field of Classification Search
None
See application file for complete search history.

(56) References Cited

U.S. PATENT DOCUMENTS

| 2005/0039682 | A1 | 2/2005 | Dhindsa et al. | |
| 2005/0090118 | A1* | 4/2005 | Shannon et al. | 438/706 |
| 2007/0029194 | A1 | 2/2007 | Matsumoto et al. | |
| 2007/0087455 | A1* | 4/2007 | Hoffman | 438/5 |
| 2007/0247074 | A1* | 10/2007 | Paterson et al. | 315/111.21 |
| 2008/0236750 | A1* | 10/2008 | Koshimizu | 156/345.38 |
| 2013/0087284 | A1* | 4/2013 | Adams et al. | 156/345.26 |

FOREIGN PATENT DOCUMENTS

JP    07-302786 A    11/1995

* cited by examiner

*Primary Examiner* — Duy Deo
(74) *Attorney, Agent, or Firm* — Pearne & Gordon LLP

(57) ABSTRACT

There is provided a plasma processing apparatus capable of optimizing a plasma process in response to various requirements of a micro processing by effectively controlling a RF bias function. In this plasma processing apparatus, a high frequency power $RF_H$ suitable for generating plasma of a capacitively coupling type is applied to an upper electrode 48 (or lower electrode 16) from a third high frequency power supply 66, and two high frequency powers $RF_{L1}$ (0.8 MHz) and $RF_{L2}$ (13 MHz) suitable for attracting ions are applied to the susceptor 16 from first and second high frequency power supplies 36 and 38, respectively, in order to control energy of ions incident onto a semiconductor wafer W from the plasma. A control unit 88 controls a total power and a power ratio of the first and second high frequency powers $RF_{L1}$ and $RF_{L2}$ depending on specifications, conditions or recipes of an etching process.

10 Claims, 18 Drawing Sheets

(LOW ADHESION RATE)

(HIGH ADHESION RATE)

FIG. 17

| 13M / 0.8M | 4500 / 0 | 4000 / 500 | 3000 / 1500 | 2000 / 2500 | 1000 / 3500 (BEST) | 0 / 4500 |
|---|---|---|---|---|---|---|
| CROSS-SECTIONAL SHAPE OF PATTERN (SEM PHOTO) | | | | | | |
| INCLINED ANGLE OF SIDEWALL OF MASK θ | 79.1 DEGREES | 77.7 DEGREES | 78.6 DEGREES | 79.0 DEGREES | 80.0 DEGREES | 81.3 DEGREES |
| ETCHING RATE OF SiO$_2$ | 304 nm/min | 270 nm/min | 293 nm/min | 293 nm/min | 355 nm/min | 368 nm/min |
| NECKING CD | 22.8 nm | 22.8 nm | 23.8 nm | 21.8 nm | 33.7 nm | 40.2 nm |

(RF BIAS: LOW POWER)

(RF BIAS: INTERMEDIATE POWER)

(RF BIAS: HIGH POWER)

(RF BIAS: LOW POWER)

(RF BIAS: INTERMEDIATE POWER)

(RF BIAS: HIGH POWER)

US 8,642,478 B2

PLASMA PROCESSING METHOD AND PLASMA PROCESSING APPARATUS

CROSS-REFERENCE TO RELATED APPLICATION

This application claims the benefit of Japanese Patent Application Nos. 2010-186017 and 2011-171005 filed on Aug. 23, 2010 and Aug. 4, 2011, respectively, and U.S. Provisional Application Ser. No. 61/382,552 filed on Sep. 14, 2010, the entire disclosures of which are incorporated herein by reference.

FIELD OF THE INVENTION

The present disclosure relates to a technology of performing a plasma process onto a target substrate, and to be specific, the present disclosure relates to a plasma processing method and a plasma processing apparatus capable of applying a high frequency power for attracting ions toward a substrate positioned in a plasma space.

BACKGROUND OF THE INVENTION

In an etching process, a deposition process, an oxidation process, or a sputtering process for manufacturing a semiconductor device or a FPD (Flat Panel Display), there has been used plasma in order to make an effective reaction of a processing gas at a relatively low temperature. In such a plasma process, there has been used a high frequency power (RF) or a microwave in order to discharge or ionize a processing gas within a vacuum processing chamber.

By way of example, in a capacitively coupled plasma processing apparatus, an upper electrode and a lower electrode are arranged in parallel with each other within a processing chamber. Further, a target substrate (a semiconductor wafer, a glass substrate or the like) is mounted on the lower electrode, and a high frequency power having a frequency (typically, about 13.56 MHz or higher) suitable for generating plasma is applied to the upper electrode or lower electrode. A high frequency electric field generated between the electrodes facing each other by applying the high frequency power accelerates electrons, and plasma is generated by a collision and ionization between the electrons and a processing gas. Further, by a gas phase reaction or a surface reaction of radicals or ions contained in the plasma, a thin film is deposited on the substrate, or a material or a thin film on a surface of the substrate is etched.

As described above, radicals and ions incident onto a substrate may be an important factor in a plasma process. In particular, the ions are important in that the ions have a physical action by an impact when the ions are incident onto the substrate.

Conventionally, in a plasma process, there has often used a RF bias method. In a RF bias method, a high frequency power having a relatively low frequency (typically, about 13.56 MHz or lower) is applied to a lower electrode for mounting thereon a substrate. Also, ions contained in plasma are accelerated by a negative bias voltage or a sheath voltage generated on the lower electrode, and are attracted to the substrate. In this way, the ions in the plasma are accelerated and the ions collide with a surface of the substrate, so that a surface reaction, an anisotropic etching process or a film modification (film reform) can be promoted.

Patent Document 1: Japanese Patent Laid-open Publication No. H7-302786

In a conventional plasma processing apparatus having the above-described RF bias function, only one kind (a single frequency) of a high frequency power for attracting ions applied to a lower electrode is used. Further, this high frequency power, and a self-bias voltage or a sheath voltage on the lower electrode are used as control parameters.

However, as a result of repeated experiments on an action of RF bias conducted by the present inventors during a development in a technology of a plasma process, it has been found that it is difficult to control an ion energy distribution in a high-tech plasma process of multiple process characteristics by a conventional method using a single high frequency power for attracting ions.

To be more specific, as a result of analyzing an energy distribution of ions (IED: Ion Energy Distribution) incident onto a substrate when a single high frequency power for attracting ions is used, as depicted in FIGS. 19A to 19C and 20A to 20C, energy of all incident ions is regularly distributed in a continuous energy band, and lots of ions are concentrated (peaks are shown) in a vicinity of the maximum energy and in a vicinity of the minimum energy. Therefore, if it is possible to readily vary not only an average value of ion energy but also the maximum energy and minimum energy on which the ions are concentrated, it is expected that a RF bias function required for a plasma process can be effectively controlled. However, it is deemed that this is not available.

In accordance with a conventional method, when a high frequency power having a relatively low frequency of, for example, about 0.8 MHz is used for attracting ions, if a RF power is varied, an ion energy distribution characteristic is varied as shown in FIG. 19A (low power), FIG. 19B (intermediate power), and FIG. 19C (high power). That is, while the minimum energy is fixed to about 0 eV, the maximum energy is varied into about 1000 eV (FIG. 19A), about 2000 eV (FIG. 19B), and about 3000 eV (FIG. 19C) in proportion to the RF power.

However, when a high frequency power having a relatively high frequency of, for example, about 13 MHz is used for attracting ions, if a RF power is varied, an ion energy distribution characteristics is varied as shown in FIG. 20A (low power), FIG. 20B (intermediate power), and FIG. 20C (high power). That is, while the maximum energy is varied into about 650 eV, about 1300 eV, and about 1950 eV in proportion to the RF power, the minimum energy is also varied into about 350 eV, about 700 eV, and about 1050 eV in proportion to the RF power.

Although FIGS. 19A to 19C and 20A to 20C show ion energy distribution characteristics of argon ($Ar^+$) ions, other ions may have the same characteristics (patterns).

As described above, in the conventional method, even if the maximum energy or average energy in an ion energy distribution can be varied, the minimum energy cannot be varied independently of the maximum energy. Therefore, it is impossible to achieve an ion energy distribution characteristic indicated by, for example, a virtual line (a dashed dotted line) K in FIG. 20C. Accordingly, as also will be described in embodiments of the present disclosure, a trade-off between (an etching rate and selectivity) and an etching profile in a HARC (High Aspect Ratio Contact) plasma etching process cannot be avoided readily.

BRIEF SUMMARY OF THE INVENTION

In order to solve the above-described conventional problems, the present disclosure provides a plasma processing method and a plasma processing apparatus capable of optimizing a plasma process in response to various requirements of a micro processing by effectively controlling a RF bias function.

In view of the foregoing, in accordance with one aspect of the present disclosure, there is provided a plasma processing method including: mounting a target substrate on a first electrode positioned within an evacuable processing chamber;

generating plasma by exciting a processing gas within the processing chamber; applying to the first electrode a first high frequency power and a second high frequency power each having a different frequency in order to attract ions from the plasma toward the substrate; and performing a plasma process on the substrate by the plasma. In performing a plasma process, a total power and a power ratio of the first and second high frequency powers are controlled to optimize at least one process characteristic which is dependent on energy of ions incident onto the substrate.

Further, in accordance with another aspect of the present disclosure, there is provided a plasma processing apparatus including an evacuable processing chamber for accommodating a target substrate and loading/unloading the substrate; a processing gas supply unit for supplying a processing gas into the processing chamber; a plasma generation unit for generating plasma of the processing gas within the processing chamber; a first electrode for mounting and holding the substrate thereon within the processing chamber; a first high frequency power supply unit for applying to the first electrode a first high frequency power having a first frequency in order to attract ions from the plasma toward the substrate on the first electrode; a second high frequency power supply unit for applying to the first electrode a second high frequency power having a second frequency higher than the first frequency in order to attract ions from the plasma toward the substrate on the first electrode; and a control unit for controlling a total power and a power ratio of the first and second high frequency powers to optimize at least one process characteristic dependent on energy of ions incident onto the substrate from the plasma.

In accordance with the present disclosure, the first and second high frequency powers having the first and second frequencies, respectively, appropriate for attracting ions are applied to the first electrode for mounting thereon the target substrate, and a total power of the first and second high frequency powers and a power ratio thereof are variably controlled. Therefore, in an energy distribution of ions incident onto the substrate from the plasma, it is possible to control the minimum energy and the maximum energy independently of each other. Further, it is also possible for an ion energy distribution characteristic to have a concave shape or a flat shape. Accordingly, the ion energy distribution characteristic can be optimized with respect to various process characteristics, and also the process characteristics can be optimized.

In accordance with a plasma processing method and a plasma processing apparatus of the present disclosure, a RF bias function can be effectively controlled by the above-described function and operation, so that a plasma process can be optimized in response to various requirements of a micro processing.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 17 shows (an enlarged view of) cross-sectional shapes of a pattern and characteristic data obtained in a HARC process performed by a dual frequency RF bias method;

DETAILED DESCRIPTION OF THE INVENTION

Hereinafter, embodiments of the present disclosure will be described in detail with reference to FIGS. 1 to 18.

[Overall Configuration of Apparatus]

Figure 1:
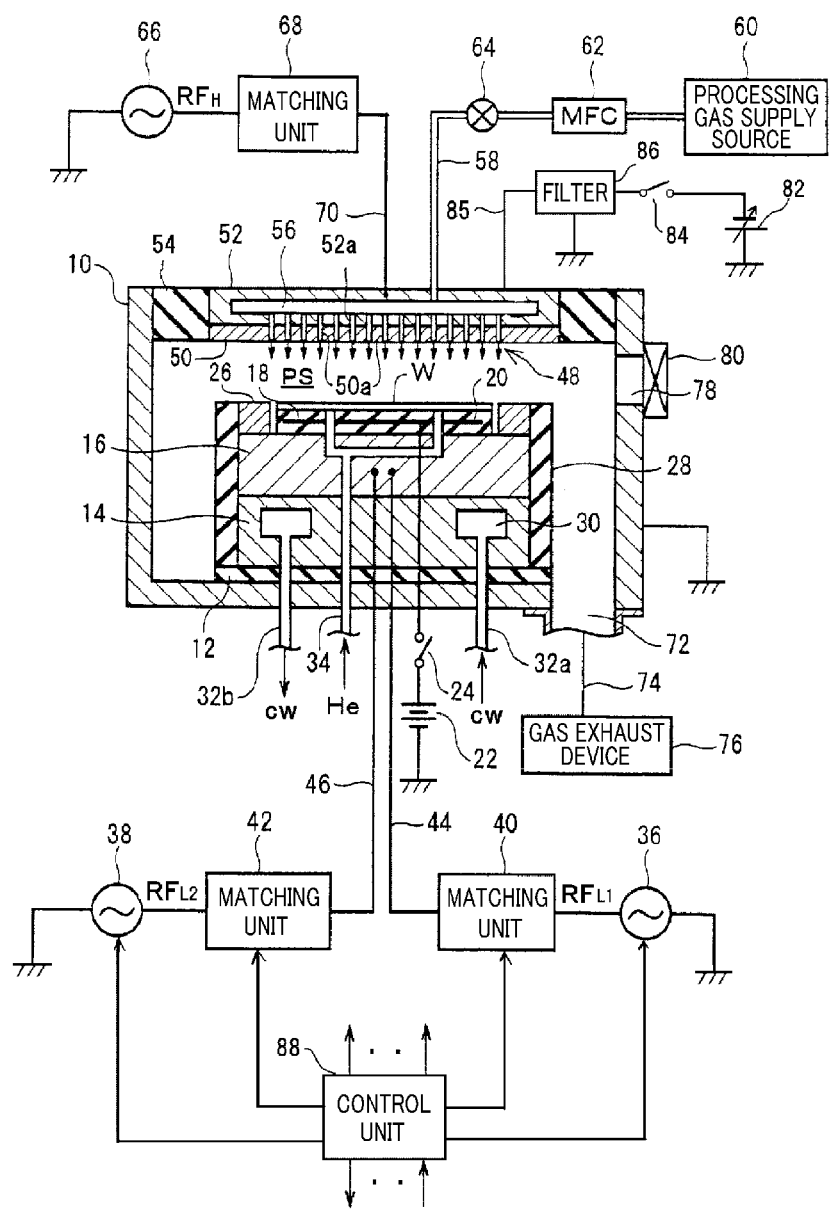
FIG. 1 is a cross-sectional view showing a configuration of a plasma processing apparatus in accordance with an embodiment of the present disclosure.

FIG. 1 shows a configuration of a plasma processing apparatus in accordance with an embodiment of the present disclosure. This plasma processing apparatus may be configured as a capacitively coupled plasma etching apparatus in which two radio frequency powers are applied to a lower electrode or a radio frequency power is applied to an upper electrode. The plasma processing apparatus may include a cylindrical vacuum chamber (processing vessel) 10 made of, e.g., aluminum whose surface is alumite-treated (anodically oxidized). The chamber 10 may be frame-grounded.

At a bottom of the chamber 10, a cylindrical susceptor support 14 may be provided via an insulating plate 12 made of ceramic or the like, and on the susceptor support 14, a susceptor 16 made of, for example, aluminum may be provided. The susceptor 16 may serve as a lower electrode and a target substrate, for example, a semiconductor wafer W may be mounted thereon.

On an upper surface of the susceptor 16, an electrostatic chuck 18 for holding the semiconductor wafer W by electrostatic attracting force may be provided. This electrostatic chuck 18 may include an electrode 20 made of a conductive film embedded between a pair of insulating layers or insulating sheets, and the electrode 20 may be electrically connected to a DC power supply 22 via a switch 24. With this configuration, the semiconductor wafer W can be attracted to and held on the electrostatic chuck 18 by an electrostatic force caused by a DC voltage from the DC power supply 22. Around the electrostatic chuck 18 and on the upper surface of the susceptor 16, a focus ring 26 made of, for example, silicon may be positioned in order to enhance uniformity of an etching process in the surface. To side surfaces of the susceptor 16 and the susceptor support 14, a cylindrical inner wall member 28 made of, for example, quartz may be secured.

Within the susceptor support 14, a coolant cavity or coolant path 30 of, e.g., a circular ring-shape may be formed. A coolant such as cooling water cw of a certain temperature may be supplied into and circulated through the coolant path 30 from an external chiller unit (not illustrated) via lines 32a and 32b. A processing temperature of the semiconductor wafer W on the susceptor 16 can be controlled depending on a temperature of the coolant cw. Further, a heat transfer gas such as a He gas may be supplied between an upper surface of the electrostatic chuck 18 and a rear surface of the semiconductor wafer W from a heat transfer gas supply mechanism (not illustrated) via a gas supply line 34.

The susceptor 16 may be electrically connected to a first high frequency power supply 36 and a second high frequency power supply 38 for attracting ions via lower matching units 40 and 42 and lower power supply conductors 44 and 46, respectively. The lower power supply conductors 44 and 46 may be configured as a common conductor such as a power supply rod.

The first high frequency power supply 36 may be configured to variably output a first high frequency power $RF_{L1}$ having a relatively low frequency of, for example, about 0.8 MHz suitable for attracting ions of plasma to the semiconductor wafer W on the susceptor 16. The second high frequency power supply 38 may be configured to variably output a second high frequency power $RF_{L2}$ having a relatively high frequency of, for example, about 13 MHz suitable for attracting ions of plasma to the semiconductor wafer W on the susceptor 16.

Above the susceptor 16, an upper electrode 48 may be provided so as to face the susceptor 16 in parallel with each other. This upper electrode 48 may include an electrode plate 50 and an electrode support 52, and may be secured at an upper space of the chamber 10 via a ring-shaped insulator 54. The electrode plate 50 may have a multiple number of gas discharge holes 50a and may be made of a semiconductor material such as Si or SiC. The electrode support 52 may be made of a conductive material such as aluminum whose surface is alumite-treated (anodically oxidized) for supporting the electrode plate 50 so as to be detachably attached thereto. Between this upper electrode 48 and the susceptor 16, a plasma generation space or a processing space PS is formed. The ring-shaped insulator 54 may be made of, for example, alumina ($Al_2O_3$). Further, the ring-shaped insulator 54 may airtightly fill up a gap between a side surface of the upper electrode 48 and a sidewall of the chamber 10, and physically support the upper electrode 48 without being grounded.

The electrode support 52 may include a gas buffer room 56 therein and a multiple number of gas vent holes 52a configured to communicate the gas buffer room 56 with the gas discharge holes 50a of the electrode plate 50 at its lower surface. The gas buffer room 56 may be connected to a processing gas supply source 60 via a gas supply line 58, and a mass flow controller (MFC) 62 and an opening/closing valve 64 may be provided at the gas supply line 58. If a certain processing gas is introduced into the gas buffer room 56 from the processing gas supply source 60, the processing gas may be electrically discharged to the processing space PS from the gas discharge holes 50a of the electrode plate 50 toward the semiconductor wafer W on the susceptor 16, as in a shower device. As described above, the upper electrode 48 may serve as a shower head for supplying the processing gas to the processing space PS.

The upper electrode 48 may be electrically connected to a third high frequency power supply 66 for plasma excitation via an upper matching unit 68 and an upper power supply conductor such as a power supply rod 70. The third high frequency power supply 66 may be configured to variably output a third high frequency power $RF_H$ having a frequency of, for example, about 60 MHz suitable for high frequency discharge of the processing gas by capacitive coupling, i.e. suitable for generating plasma. Typically, a frequency of the third high frequency power $RF_H$ for generating plasma may be selected from a range of from about 27 MHz to about 300 MHz.

An annular space formed between the susceptor 16 and the sidewall of the chamber 10 and between the susceptor support 14 and the sidewall of the chamber 10 may serve as a gas exhaust space, and at the bottom of this gas exhaust space, a gas exhaust port 72 of the chamber 10 may be formed. This gas exhaust port 72 may be connected to a gas exhaust device 76 via a gas exhaust line 74. The gas exhaust device 76 may include a vacuum pump such as a turbo molecular pump and may be configured to depressurize the inside of the chamber 10, particularly, the processing space PS to a required vacuum level. At the sidewall of the chamber 10, a gate valve 80 configured to open and close a loading/unloading port 78 for the semiconductor wafer W may be provided.

An output terminal of a variable DC power supply 82 provided outside the chamber 10 may be electrically connected to the upper electrode 48 via a switch 84 and a DC power supply line 85. The variable DC power supply 82 may be configured to output a DC voltage $V_{DC}$ ranging from, for example, about −2000 V to about +1000 V.

A filter circuit 86 provided on the way of the DC power supply line 85 may apply the DC voltage $V_{DC}$ from the variable DC power supply 82 to the upper electrode 48. Further, the filter circuit 86 may allow a high frequency power supplied to the DC power supply line 85 from the susceptor 16 via the processing space PS and the upper electrode 48 to flow through a ground line but not to flow toward the variable DC power supply 82.

Further, at a certain place in contact with the processing space PS within the chamber 10, a DC ground part (not illustrated) made of a conductive material such as Si or SiC may be provided. This DC ground part may be constantly grounded via a ground line (not illustrated).

A control unit 88 may include a micro computer and may individually and overall control operations of respective parts of the plasma etching apparatus, for example, the switch 24 for the electrostatic chuck, the first, second and third high frequency power supplies 36, 38 and 66, the matching units 40, 42 and 68, the processing gas supply unit 60, 62 and 64, the gas exhaust device 76, the variable DC power supply 82 and the switch 84 for DC bias, the chiller unit, and the heat transfer gas supply unit. Further, the control unit 88 may be connected to a touch panel (not shown) serving as a man-machine interface and storage unit (not shown) for storing therein various program or data such as preset values. Furthermore, in the present embodiment, the control unit 88 and a DC controller 83 serve as a DC bias control unit.

In order to perform an etching process in this plasma etching apparatus, the gate valve 80 is opened, and the semiconductor wafer W as a target to be processed is loaded into the chamber 10 and mounted on the electrostatic chuck 18. Then, a certain processing gas, i.e. an etching gas (generally, a mixed gas), may be introduced into the chamber 10 from the processing gas supply source 60 at a certain flow rate and a certain flow rate ratio. Then, the inside of the chamber 10 may be vacuum exhausted to a preset pressure level by the gas exhaust device 76. Further, the third high frequency power $RF_H$ (60 MHz) for generating plasma may be applied from the third high frequency power supply 66 to the upper electrode 48 with a certain power level. Meanwhile, the first high frequency power $RF_{L1}$ (0.8 MHz) and second high frequency power $RF_{L2}$ (13 MHz) for attracting ions may be respectively applied from the first and second high frequency power supplies 36 and 38 with a certain power level to the susceptor (lower electrode) 16. Then, the switch 24 may be turned on, and a heat transfer gas (a He gas) may be confined in a contact interface between the electrostatic chuck 18 and the semiconductor wafer W by electrostatic attraction force. Further, if necessary, the switch 84 may be turned on, and a certain DC voltage $V_{DC}$ may be applied from the variable DC power supply 82 to the upper electrode 48. The etching gas discharged from the shower head (upper electrode) 48 may be excited into plasma between both electrodes 16 and 48 by high frequency discharge, and a film on a main surface of the semiconductor wafer W may be etched by radicals or ions contained in the plasma.

In order to control energy of ions which is incident onto the semiconductor wafer W from the plasma during the process, the plasma etching apparatus of this embodiment may include hardware 36 to 46 in which two kinds of high frequency powers $RF_{L1}$ (0.8 MHz) and $RF_{L2}$ (13 MHz) suitable for attracting ions are applied to the susceptor 16 from the two high frequency power supplies 36 and 38. Further, the control unit 88 may control a total power of both high frequency powers $RF_{L1}$ and $RF_{L2}$ and a power ratio thereof depending on specifications, conditions or recipes of an etching process.

[RF Bias Function in Embodiment]

Figure 2:
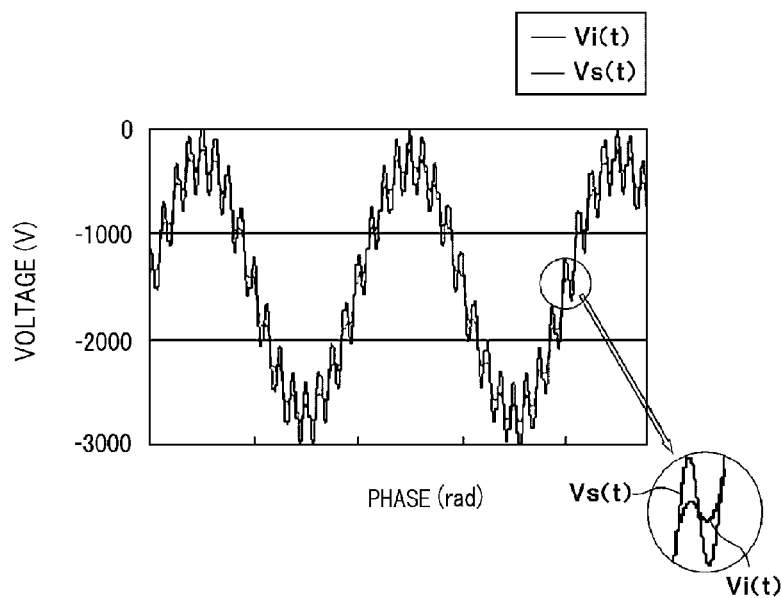
FIG. 2 shows a waveform of a sheath voltage and an ion response voltage in a dual frequency RF bias method in the embodiment.

In the plasma etching apparatus of the present embodiment, as described above, the first high frequency power $RF_{L1}$ (0.8 MHz) and the second high frequency power $RF_{L2}$ (13 MHz) for attracting ions may be applied to the susceptor (lower electrode) 16 from the first high frequency power supply 36 and the second high frequency power supply 38, respectively, during the process. Then, as depicted in FIG. 2, a negative sheath voltage $V_s(t)$ in which both high frequency powers $RF_{L1}$ and $RF_{L2}$ are applied may be generated in an ion sheath on a surface of the semiconductor wafer W or the susceptor 16 in contact with the plasma generation space PS. FIG. 2 shows a case where a voltage (power) of the second high frequency power $RF_{L2}$ is much lower than a voltage (power) of the first high frequency power $RF_{L1}$ in order to easily explain the application of the both high frequency powers $RF_{L1}$ and $RF_{L2}$ within the ion sheath.

Ions from the plasma may be accelerated by the sheath voltage $V_s(t)$ and incident onto the surface of the semiconductor wafer W. In this case, acceleration or energy of the incident ions may depend on an instantaneous value (absolute value) of the sheath voltage $V_s(t)$ at that moment. That is, ions introduced into the ion sheath when the instantaneous value (absolute value) of the sheath voltage $V_s(t)$ is high may be incident onto the surface of the wafer W with high acceleration or high kinetic energy, whereas ions introduced into the ion sheath when the instantaneous value (absolute value) of the sheath voltage $V_s(t)$ is low may be incident onto the surface of the wafer W with low acceleration or low kinetic energy.

Figure 3:
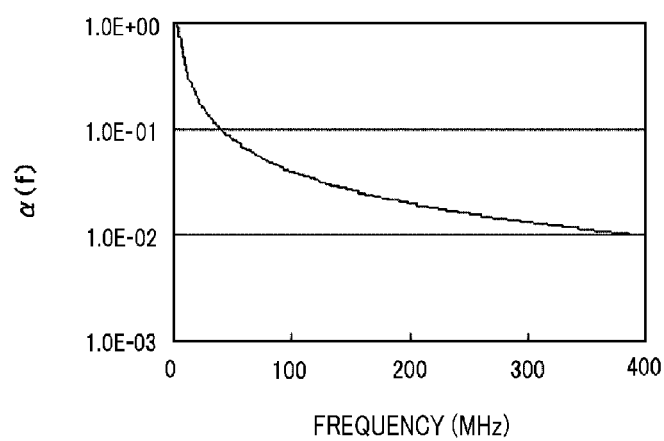
FIG. 3 shows a conversion function employed in the embodiment.

Herein, the ions within the ion sheath may respond (accelerate) to the sheath voltage $V_s(t)$ with specific sensitivity equal to or less than about 100% (coefficient of 1). This response sensitivity or a conversion function α(f) may vary depending on (in inverse proportion to) a frequency f of a high frequency power used for RF bias as depicted in FIG. 3, and may be expressed by the following equation (1).

$$\alpha(f) = 1/\{(cf\tau_i)^p + 1\}^{1/p} \tag{1}$$

Herein, $c = 0.3 \times 2\pi$, $p = 5$, $\tau_i = 3s\,(M/2\,eV_s)$, M denotes a mass number of ions, s denotes a sheath passing time of ions, and $V_s$ denotes a sheath voltage.

Therefore, a net sheath voltage, i.e. an ion response voltage $V_i(t)$, contributing to the acceleration of the ions within the ion sheath may be expressed by the following equation (2).

$$V_i(t) = \alpha(f) V_s(t) \tag{2}$$

FIGS. 2 and 3 respectively show the ion response voltage $V_i(t)$ and the conversion function $\alpha(f)$ of $Ar^+$ ions. However, other ions may have the same characteristics with respect to the sheath voltage $V_s(t)$ and the frequency for RF bias.

As can be seen from a voltage waveform of FIG. 3, the ions within the ion sheath may respond (accelerate) to the first high frequency power $RF_{L1}$ (0.8 MHz) having a relatively low frequency with sensitivity of about 100% ($\alpha(f) \approx 1$). Further, ions within the ion sheath may respond (accelerate) to the second high frequency power $RF_{L2}$ (13 MHz) having a relatively high frequency with sensitivity of about 50% ($\alpha(f) \approx 0.5$).

Figure 4:
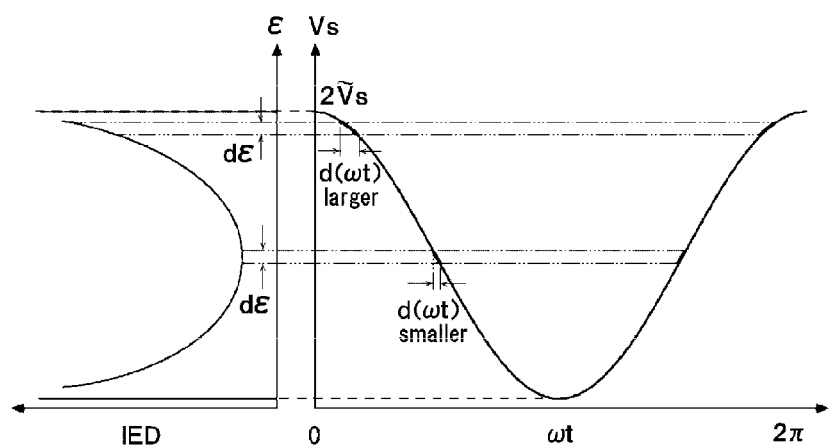
FIG. 4 shows an ion energy distribution and an ion response voltage in a single frequency RF bias method.
Figure 5:
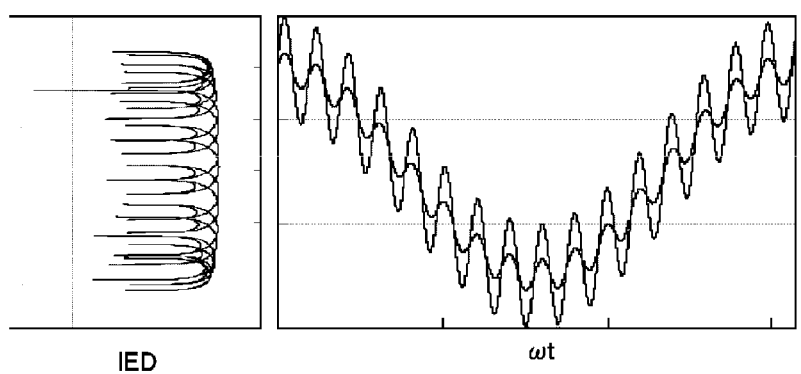
FIG. 5 shows an ion energy distribution and an ion response voltage in a dual frequency RF bias method.

Based on the ion response voltage $V_i(t)$ as described above, an ion energy distribution (IED) can be calculated from the following equation (3) in the manner as depicted in FIGS. 4 and 5.

$$IED(E_i) \propto \Sigma_i (dV_i/dt_i) \tag{3}$$

FIG. 4 shows an IED and an ion response voltage $V_i(t)$ when a single high frequency power having a relatively low frequency is used for RF bias. Meanwhile, FIG. 5 shows an IED and an ion response voltage $V_i(t)$ when two high frequency powers each having a relatively low frequency or a relatively high frequency are used for RF bias.

In accordance with a single frequency bias method using a single high frequency power for RF bias, as described above with reference to FIGS. 19A to 19C and FIGS. 20A to 20C, regularly, an ion energy distribution (IED) has a shape that lots of ions are concentrated (peaks are shown) in the vicinity of the maximum energy and in the vicinity of the minimum energy, and it may be impossible to vary the minimum energy as desired even if a RF power varies in any way.

In this regard, in accordance with a dual frequency bias method using two high frequency powers $RF_{L1}$ (0.8 MHz) and $RF_{L2}$ (13 MHz) for RF bias in the same manner as the present embodiment, by adjusting a total power and/or a power ratio of both high frequency powers $RF_{L1}$ and $RF_{L2}$, it is possible to control the maximum energy and the minimum energy in the ion energy distribution (IED) independently of each other.

Figure 6A:
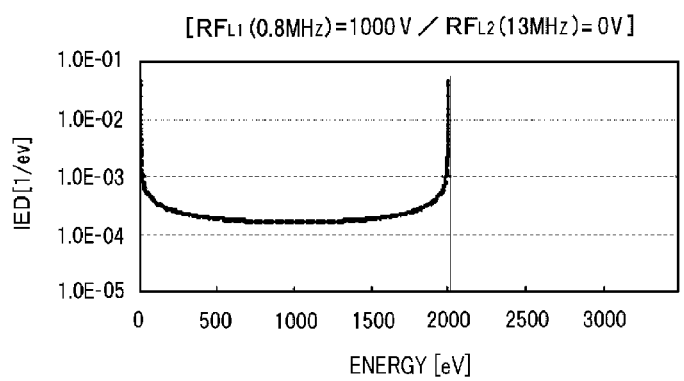
FIG. 6A shows a function of adjusting the minimum energy of an ion energy distribution within a certain range as desired while the maximum energy is fixed in the embodiment.
Figure 6B:
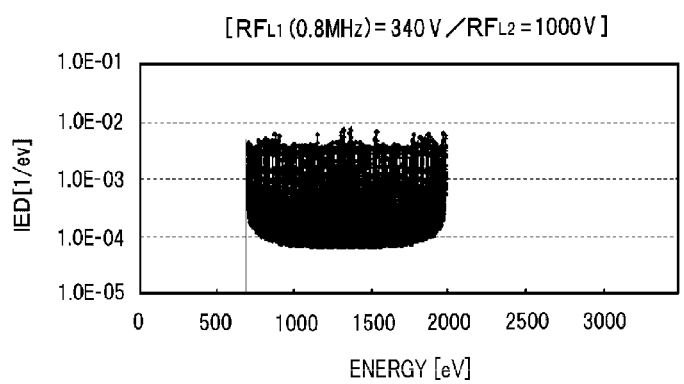
FIG. 6B shows a function of adjusting the minimum energy of an ion energy distribution within a certain range as desired while the maximum energy is fixed.
Figure 6C:
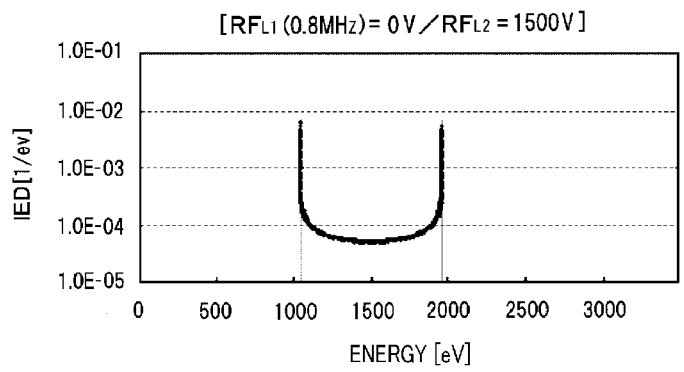
FIG. 6C shows a function of adjusting the minimum energy of an ion energy distribution within a certain range as desired while the maximum energy is fixed.

That is, in the present embodiment, as depicted in FIGS. 6A to 6C, while the maximum energy is fixed to, for example, about 2000 eV, the minimum energy can be adjusted in a range of, for example, from about 0 eV to about 1000 eV as desired.

Figure 7A:
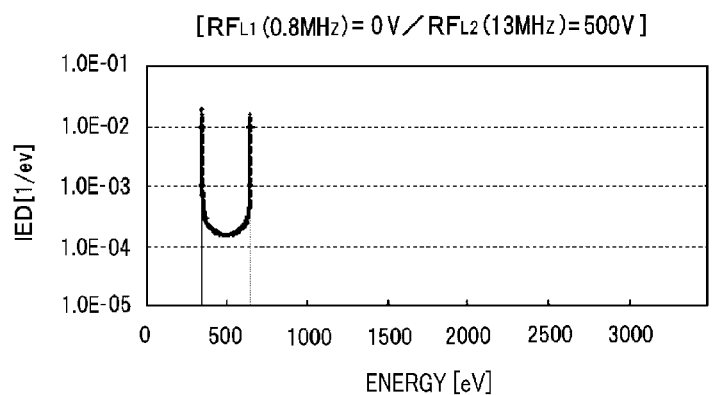
FIG. 7A shows a function of adjusting the maximum energy of an ion energy distribution within a certain range as desired while the minimum energy is fixed in the embodiment.
Figure 7B:
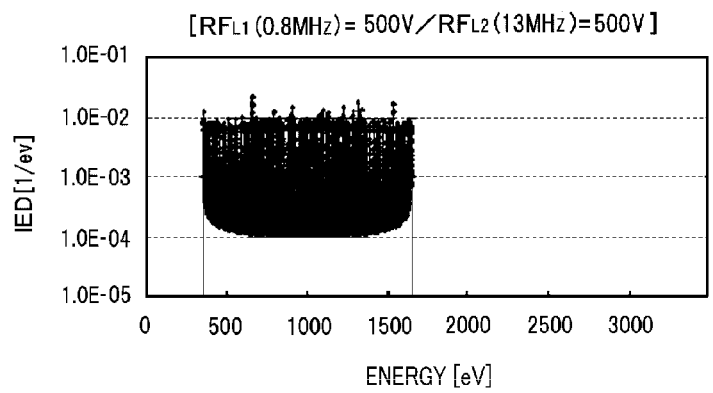
FIG. 7B shows a function of adjusting the maximum energy of an ion energy distribution within a certain range as desired while the minimum energy is fixed.
Figure 7C:
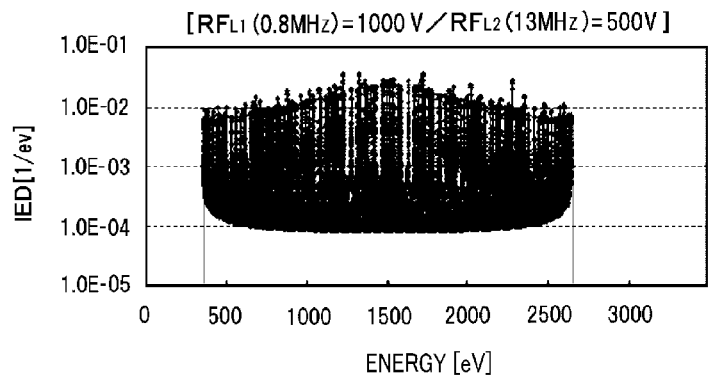
FIG. 7C shows a function of adjusting the maximum energy of an ion energy distribution within a certain range as desired while the minimum energy is fixed.

Further, as depicted in FIGS. 7A to 7C, while the minimum energy is fixed to, for example, about 350 eV, the maximum energy can be adjusted in a range of, for example, from about 650 eV to about 2650 eV as desired.

FIGS. 6A to 6C and FIGS. 7A to 7C show the IED characteristics of $Ar^+$ ions, but other ions may have the same characteristics with respect to the IED patterns. Further, each voltage value of the both high frequency powers $RF_{L1}$ (0.8 MHz) and $RF_{L2}$ (13 MHz) corresponds to an amplitude value of each bias voltage of the both high frequency powers and may be converted into RF powers.

In the present embodiment, as shown in FIG. 6B [$RF_{L1}$ (0.8 MHz)=340 V and $RF_{L2}$ (13 MHz)=1000 V] and FIG. 7B [$RF_{L1}$ (0.8 MHz)=500 V and $RF_{L2}$ (13 MHz)=500 V], it may be possible to distribute ions substantially uniformly throughout the entire range of an energy band by using dual frequency RF bias power. Further, as depicted in FIG. 7C [$RF_{L1}$ (0.8 MHz)=1000 V and $RF_{L2}$ (13 MHz)=500 V], it may be possible to adjust the number of incident ions at an intermediate energy to be greater than the number of incident ions at the minimum energy and the maximum energy.

Figure 8A:
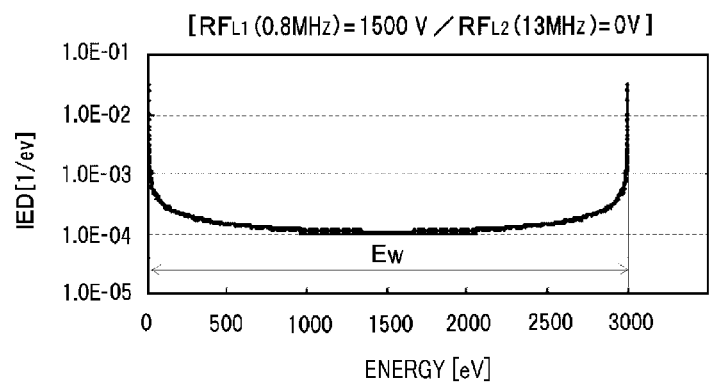
FIG. 8A shows a function of varying a width of an energy band within a certain range as desired while a central value of energy is fixed in the embodiment.
Figure 8B:
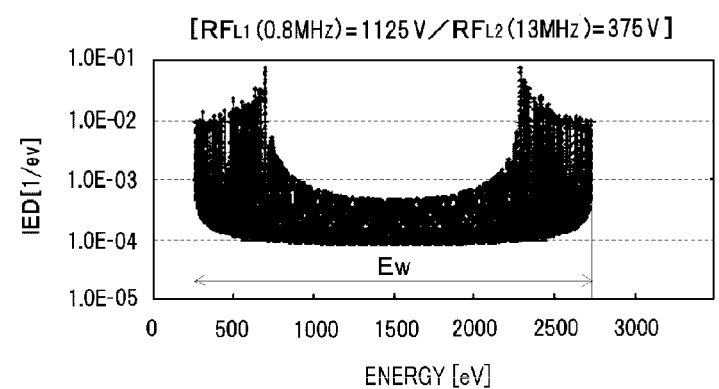
FIG. 8B shows a function of varying a width of an energy band within a certain range as desired while a central value (an average value) of energy is fixed.
Figure 8C:
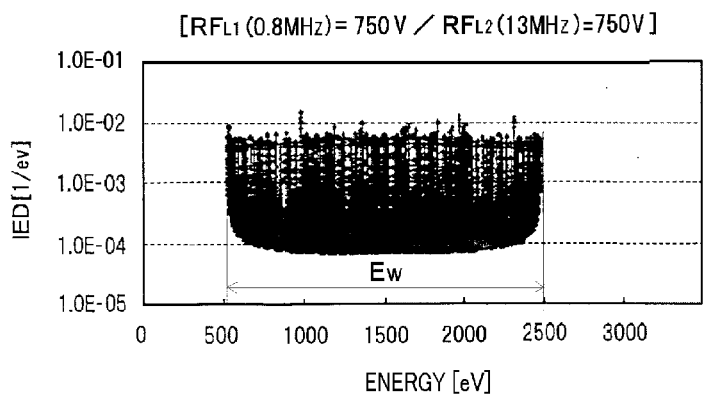
FIG. 8C shows a function of varying a width of an energy band within a certain range as desired while an average value of energy is fixed.
Figure 8D:
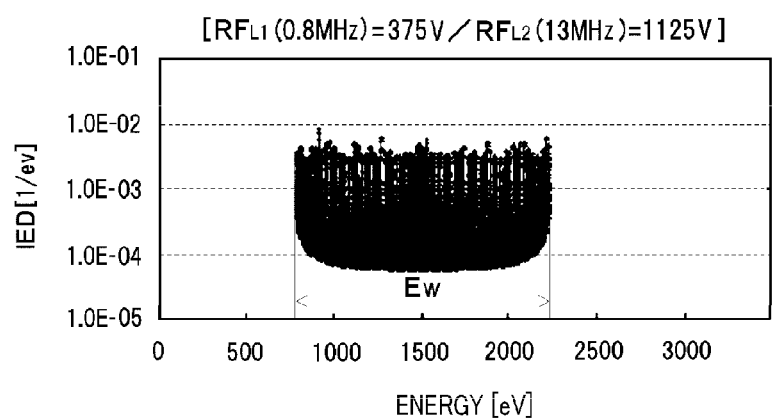
FIG. 8D shows a function of varying a width of an energy band within a certain range as desired while an average value of energy is fixed.
Figure 8E:
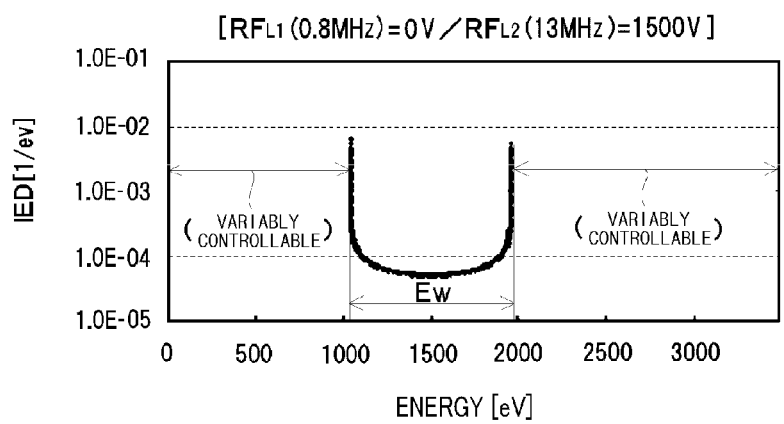
FIG. 8E shows a function of varying a width of an energy band within a certain range as desired while an average value of energy is fixed.

In the present embodiment, as depicted in FIG. 8A [$RF_{L1}$ (0.8 MHz)=1500 V and $RF_{L2}$ (13 MHz)=0 V], FIG. 8B [$RF_{L1}$ (0.8 MHz)=1125 V and $RF_{L2}$ (13 MHz)=375 V], FIG. 8C [$RF_{L1}$ (0.8 MHz)=750 V and $RF_{L2}$ (13 MHz)=750 V], FIG. 8D [$RF_{L1}$ (0.8 MHz)=375 V and $RF_{L2}$ (13 MHz)=1125 V], and FIG. 8E [$RF_{L1}$ (0.8 MHz)=0 V and $RF_{L2}$ (13 MHz)=1500 V], it may be possible to vary a width $E_w$ of the energy band in a range of, for example, from about 1000 eV to about 3000 eV while an average value or a central value of energy is fixed to, for example, about 1500 eV by using the dual frequency RF bias power.

As described above, in the present embodiment, it may be possible to obtain intermediate IED characteristics by adjusting the width $E_w$ of the energy band, as desired, between an IED characteristic (FIG. 8A) when only the first high frequency power $RF_{L1}$ (0.8 MHz) for RF bias is used and an IED characteristic (FIG. 8E) when only the second high frequency power $RF_{L2}$ (13 MHz) for RF bias is used.

Among the intermediate IED characteristics, an IED characteristic of FIG. 8B obtained when a power ratio of the second high frequency power $RF_{L2}$ to the first high frequency power $RF_{L1}$ is 1125 V:375 V=3:1 shows a distribution in a distinguishable concave shape. That is, ions may be concentrated in a band at the minimum energy and in the vicinity thereof (about 250 eV to about 750 eV) and at the maximum energy and in the vicinity thereof (about 2250 eV to about 2750 eV). Meanwhile, fewer ions may be distributed uniformly at an intermediate energy band (about 750 eV to about 2250 eV). This concave-shaped IED characteristic may be different from a U-shaped IED characteristic (FIGS. 8A and 8E) showing that ions are concentrated on a narrow line at the minimum energy and the maximum energy as in case where any one of the both high frequency powers $RF_{L1}$ and $RF_{L2}$ for RF bias is used.

Although illustration is omitted, between FIG. 8D [$RF_{L1}$ (0.8 MHz)=375 V and $RF_{L2}$ (13 MHz)=1125 V] and FIG. 8E [$RF_{L1}$ (0.8 MHz)=0 V and $RF_{L2}$ (13 MHz)=1500 V], i.e. when a power ratio of the second high frequency power $RF_{L2}$ to the first high frequency power $RF_L$ is about 1:30, it may be possible to obtain an intermediate IED characteristic of a concave shape in the same manner as shown in FIG. 8B.

As described above, in the present embodiment, the first high frequency power $RF_{L1}$ and the second high frequency power $RF_{L2}$ each having a different frequency may be used as a RF bias power. Further, a total power and/or a power ratio of these high frequency powers may be adjusted. Accordingly, an energy band width and a distribution shape of the ion energy distribution (IED) of the ions incident onto the surface of the semiconductor wafer W on the susceptor 16 can be controlled in various ways.

The first high frequency power $RF_{L1}$ and the second high frequency power $RF_{L2}$ are not limited to the above-described values (0.8 MHz and 13 MHz, respectively), and can be set from a certain range as desired. As can be seen from a comparison between the IED characteristic of FIG. 8A and the IED characteristic of 8E, in case of a single frequency bias power, a width (an energy band) $E_w$ of an ion energy distribution may become wider as a frequency becomes high and may become narrower as a frequency becomes low.

Figure 9:
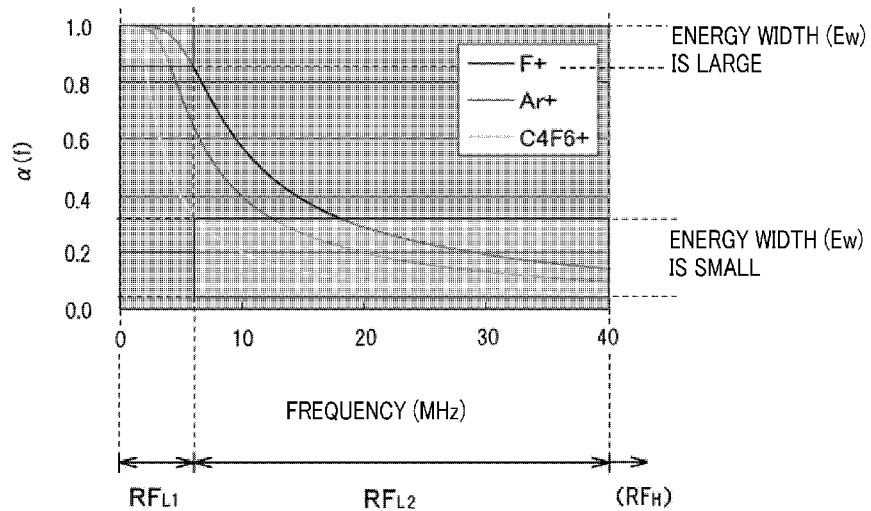
FIG. 9 is a diagram for explaining a combination of frequencies in a dual frequency RF bias method of the embodiment.

This relationship corresponds to a relationship between a frequency and a conversion function $\alpha(f)$ as depicted in FIG. 9. Therefore, in order to increase a variable range of the energy band width $E_w$, it depends on a kind of an ion ($F^+$, $Ar^+$, $C_4F_6{}^+$ or the like) mainly acting in an etching process. However, basically, the first high frequency power $RF_{L1}$ needs to have a relatively low frequency (for example, about 100 kHz to about 6 MHz) and the second high frequency power $RF_{L2}$ needs to have a relatively high frequency (for example, about 6 MHz to about 40 MHz). In particular, if a frequency of the second high frequency power $RF_{L2}$ is too high, that is, the frequency is greater than about 40 MHz, it may become inappropriate for RF bias due to its strong effect of plasma generation. Thus, the second high frequency power $RF_{L2}$ needs to have a frequency of about 40 MHz or lower.

Experimental Example of Process

As described above, the plasma etching apparatus of the present embodiment can remarkably improve controllability of a RF bias function, and in particular, high performance in anisotropic etching can be achieved as compared with the conventional apparatus.

Figure 10:
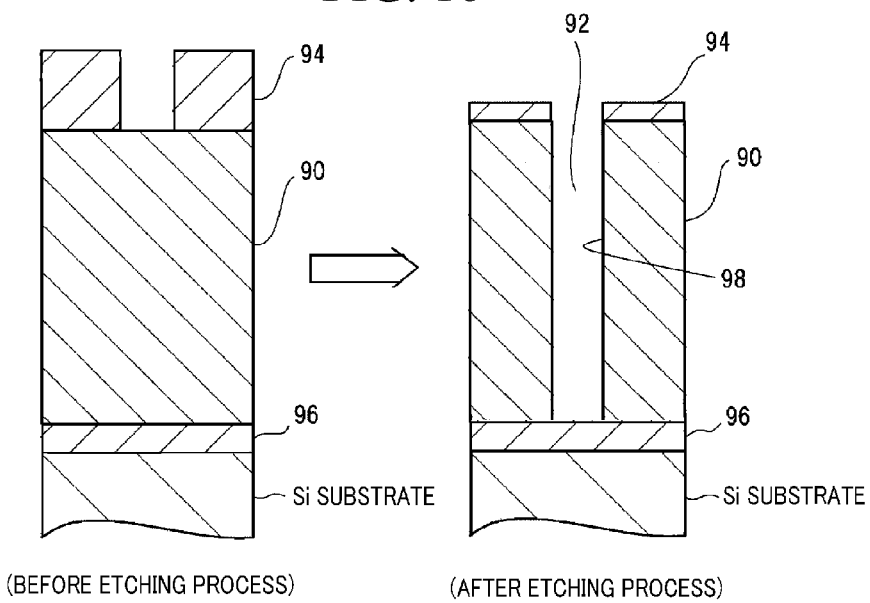
FIG. 10 is a longitudinal cross-sectional view schematically showing an etching process in a HARC process.

Herein, as an appropriate etching process performed by the plasma etching apparatus of the present embodiment, a HARC (High Aspect Ratio Contact) process will be explained with reference to FIG. 10. The HARC process may be an etching process for forming a narrow and deep contact hole (or a via hole) 92 in an insulating film or an oxide film (typically, a $SiO_2$ film). Further, the HARC has been used for contact etching (or via hole etching) for a BEOL (Back End of Line) in a manufacturing process of a large-scale integrated circuit.

In the HARC process, an anisotropic shape of high precision and a high selectivity with respect to a mask 94 (and an underlying film 96) may be required in order to form the fine hole 92 of a high aspect ratio. For this reason, there has been used a method of performing a vertical etching process by vertically attracting ions such as $CF_x{}^+$ or $Ar^+$ into the hole 92 of the $SiO_2$ film 90 by RF bias while a fluorocarbon-based gas is used as an etchant gas and a polymer film as a sidewall protective film is deposited on the mask 94 and a sidewall 98 of the hole 92 of the $SiO_2$ film 90 with $CF_x$ radicals. In this case, since F radicals having chemically high activity may reduce anisotropy and selectivity, a gas such as $C_4F_8$, $C_5F_8$ or $C_4F_6$ generating fewer F radicals and having a high C/F ratio has been widely used.

In this HARC process, in order to increase an etching rate of the $SiO_2$ film, (1) an increase in amount of incident ions, (2) an increase in total amount of F in radicals, and (3) sufficient ion energy may be required. To satisfy the requirement (1), [1] a method of adjusting a high frequency power for generating plasma has been employed; to satisfy the requirement (2), [2] a method of adjusting a flow rate of a fluorocarbon gas (for example, $C_4F_8$) has been employed; and to satisfy the requirement (3), [3] a method of adjusting a high frequency power for attracting ions has been employed.

Further, in order to increase selectivity of the $SiO_2$ film 90 with respect to the mask 94 (and the underlying film 96), (4) an appropriate flow rate ratio of $O_2/C_4F_8$, and (5) an increase in total gas flow rate caused by addition of Ar may be required. To satisfy the requirement (4), [4] a method of adjusting a flow rate of an $O_2$ gas has been employed, and to satisfy the requirement (5), [5] a method of adjusting a flow rate of an Ar gas has been employed.

The requirements (4) and (5) related to the selectivity may be based on the following etching mechanism. That is, in a normal etching state, fluorocarbon radicals are constantly irradiated onto a surface of a $SiO_2$ film, and thus, a CF film having multi-molecular layers may be formed on the surface of the $SiO_2$ film. A thickness of this CF film may have a close relationship with an etching rate.

Figure 11A:
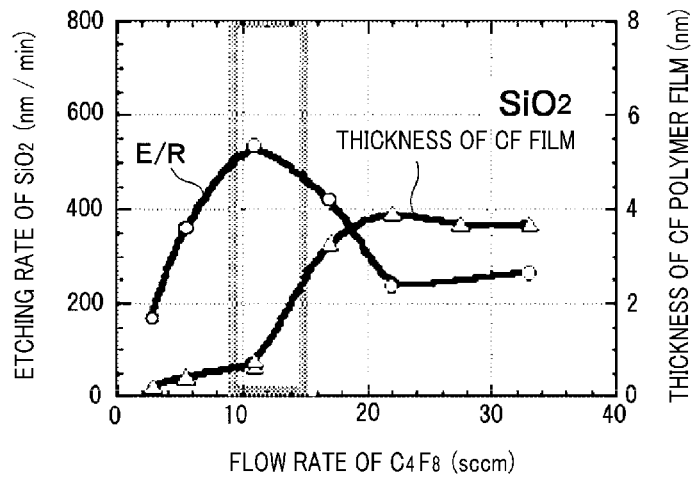
FIG. 11A is a graph showing an etching rate and a thickness of a CF polymer film when a flow rate of a $C_4F_8$ gas is changed in an etching process for a $SiO_2$ film.
Figure 11B:
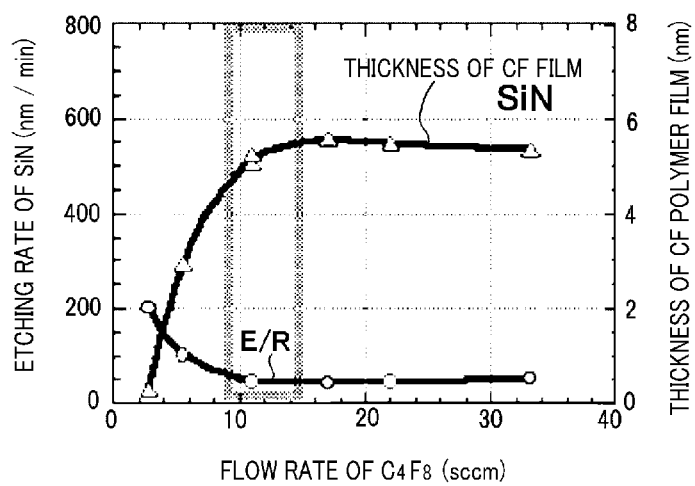
FIG. 11B is a graph showing an etching rate and a thickness of a CF polymer film when a flow rate of a $C_4F_8$ gas is changed in an etching process for a SiN film.

FIGS. 11A and 11B show that, in case of using a mixed gas of $C_4F_8/Ar/O_2$ as an etching gas, each etching rate of a $SiO_2$ film and a SiN film, and thicknesses of CF polymer films deposited on these films while a flow rate of a $C_4F_8$ gas is varied and a flow rate of each of an Ar gas and an $O_2$ gas is fixed.

As depicted in FIG. 11A, in an etching process for the $SiO_2$ film, as a flow rate of the $C_4F_8$ gas is increased, an etching rate (E/R) is increased up to about 11 sccm as a maximum value. Thereafter, the etching rate (E/R) is decreased in inverse proportion to an increase in a thickness of the CF film, and is scarcely changed at about 22 sccm or more. In this case, when the flow rate of the $C_4F_8$ gas is about 11 sccm, the thickness of the CF film on the $SiO_2$ film is as thin as about 1 nm since oxygen released during the etching process for the $SiO_2$ film reacts with the CF film and produce a volatile material (i.e. remove the CF film).

As depicted in FIG. 11B, in an etching process for the SiN film, nitrogen is released instead of oxygen. However, since the nitrogen is much less capable of removing the CF film as compared with the oxygen, a thickness of the CF film on the SiN film is as thick as about 5 nm, so that the etching can be suppressed.

In both etching processes for the $SiO_2$ film and the SiN film, the $O_2$ gas as an additive gas may adjust a removing rate of the CF film.

In the HARC process, a SiN film may be used as the underlying film 96 and typically, an organic film may be used as the mask 94. With respect to an etching rate and a thickness of the CF film when a flow rate of the $C_4F_8$ gas is varied under the same conditions as described above, the same characteristics as the SiN film can be seen in a case where the organic film is used as the mask 94.

As described above, in order to increase the selectivity of the $SiO_2$ film, it is possible to use a difference in a thickness of the CF film (a difference in an etching rate) based on whether or not oxygen is released during an etching process or based on a difference in amount of released oxygen. Further, in order to increase the selectivity of the $SiO_2$ film, [4] a flow rate ratio of $O_2/C_4F_8$ may be adjusted, and also [5] F atom radicals that deteriorates the selectivity may be reduced by addition of Ar (i.e. a total gas flow rate is increased). Accordingly, it may be possible to sufficiently increase the selectivity of the $SiO_2$ film with respect to the SiN film as the underlying film 96 or the organic film (which may include photoresist as an upper layer) as the mask 94.

As described above, in a typical plasma etching apparatus, by using respective methods of adjusting [1] a high frequency power for generating plasma, [2] a flow rate of a fluorocarbon gas (for example, $C_4F_8$), [3] a high frequency power for attracting ions, [4] a flow rate ratio of $O_2/C_4F_8$ (particularly, a flow rate of $O_2$), and [5] a flow rate of Ar, it may be possible to achieve a high etching rate and high selectivity in a HARC process. However, since very high selectivity is required in the HARC process, a very high deposition rate needs to be considered, so that radicals having a high adhesion rate needs to be used.

Figure 12A:
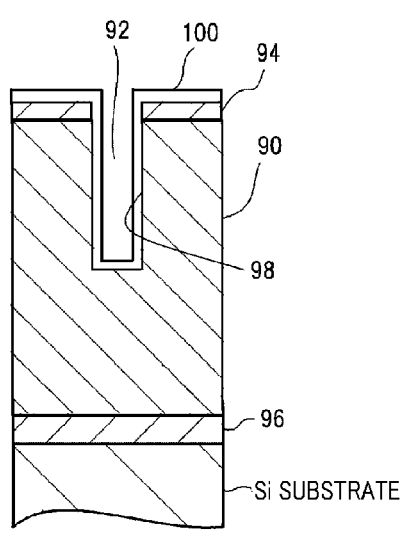
FIGS. 12A and 12B are longitudinal cross-sectional views each schematically showing a necking in a HARC process.
Figure 12B:
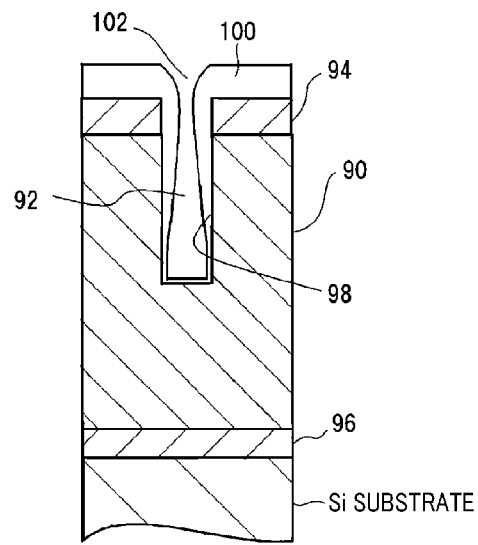

In this case, as depicted in FIG. 12B, coatability (coverage) of a deposition film 100 on the sidewall 98 may deteriorate and an entrance of the hole 92 may become narrow, and, thus, a necking 100 may be caused easily. If the necking 100 is caused, radicals or ions may not be sufficiently attracted to the bottom of the hole 92. Therefore, a decrease in a CD (Critical Dimension) of the bottom of the hole or a decrease in a vertical etching rate of the hole bottom. Further, incident ions may be reflected from an upper portion of the necking 100, and a bowing of the sidewall 98 may occur in a lower portion of the necking 100.

As described above, in order to achieve high selectivity, it may be necessary to use radicals having a high adhesion rate ($C_xF_y$ radicals), but such radicals may easily cause the necking 100. However, if radicals having a low adhesion rate are used to avoid the necking 100, the deposition film 100 on the mask 94 may become too thin as depicted in FIG. 12A and thus high selectivity cannot be achieved.

As described above, there is a trade-off relationship between a blanket characteristic (an etching rate and selectivity) and an etching profile in the HARC process. Thus, it is impossible to solve this trade-off problem by the conventional RF bias technology using a high frequency power having a single frequency for attracting ions.

Figure 13A:
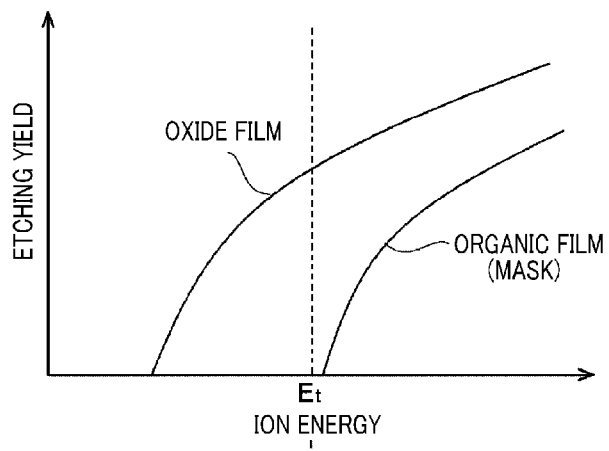
FIGS. 13A and 13B show ion energy dependency of an etching yield of an oxide film and an organic film in a HARC process, and also show an ion energy distribution characteristic by a conventional single frequency RF bias method.

FIG. 13A shows etching yield characteristics of an oxide film ($SiO_2$) and an organic film with respect to energy of incident ions when radicals having a high adhesion rate are used in a HARC process. As described above, if the radicals having a high adhesion rate are used, a surface of the mask (organic film) may be protected by a deposition film at a low ion energy band and only the oxide film may be selectively etched. In addition, if the ion energy band becomes higher than a certain threshold value $E_t$, physical etching by means of irradiation of ions exceeds the protection of the deposition film, and, thus the mask (organic film) becomes etched. As the energy of the incident ions is increased, the etching yield of the oxide film is increased slowly.

Figure 13B:
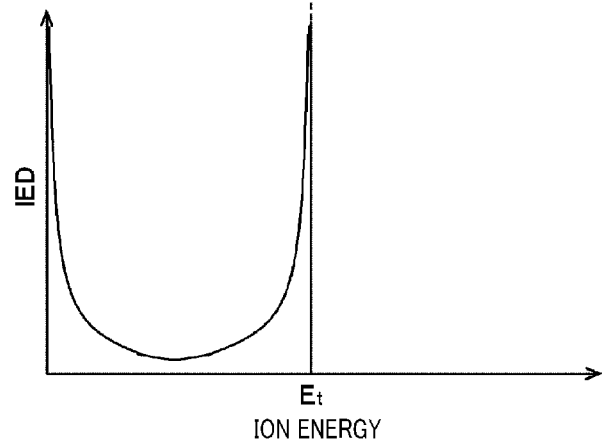

In order to increase selectivity, an ion energy distribution need to have a shape where ions are concentrically distributed at an energy band near the threshold value $E_t$ as shown in FIG. 13B. However, in accordance with the conventional single frequency RF bias method (the single frequency bias method), an ion energy distribution is arranged entirely in a range lower than the threshold value $E_t$. In this case, ions concentrated in the vicinity of the minimum energy may hardly contribute to the etching for the oxide film. Even though high selectivity may be achieved by means of ions concentrated in the vicinity of the maximum energy, the above-described necking 100 cannot be avoided or prevented.

Figure 14A:
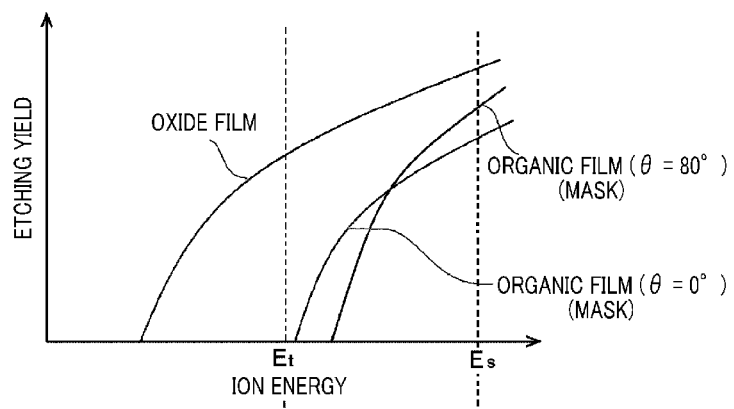
FIGS. 14A and 14B show ion energy dependency of an etching yield of an oxide film and an organic film in a HARC process, and also show an ion energy distribution characteristic by a dual frequency RF bias method of the embodiment.
Figure 15:
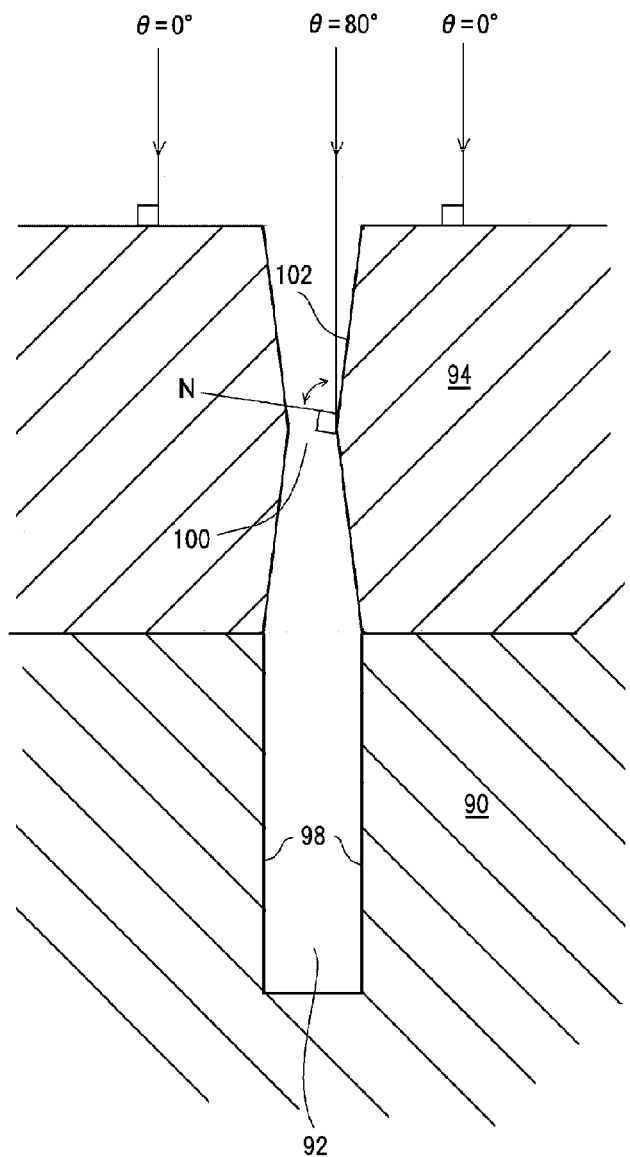
FIG. 15 shows an incident angle when ions are incident onto each position of a mask (an organic film) in a HARC process.

In a HARC process as depicted in FIG. 15, the present inventors have found the following fact by comparing etching yield characteristics with respect to ion energy at a position (an upper surface of the mask) where an incident angle θ to a normal line N of a surface of an organic film is about 0° and at a position (an inclined surface 102 of the necking) where the incident angle θ to the normal line N of the surface of the organic film is about 80°. That is, as depicted in FIG. 14A, an etching yield at the upper surface of the mask (θ=0°) may be shown earlier than an etching yield at the necking (θ=80°). However, if energy of incident ions exceeds a certain value Es, the inclined surface 102 of the necking (θ=80°) may become easier to be etched than the upper surface of the mask (θ=0°). That is, the upper surface of the mask may be etched by ions, but the inclined surface 102 of the necking may be etched more efficiently. Accordingly, it is possible to increase a CD of the necking.

Figure 14B:
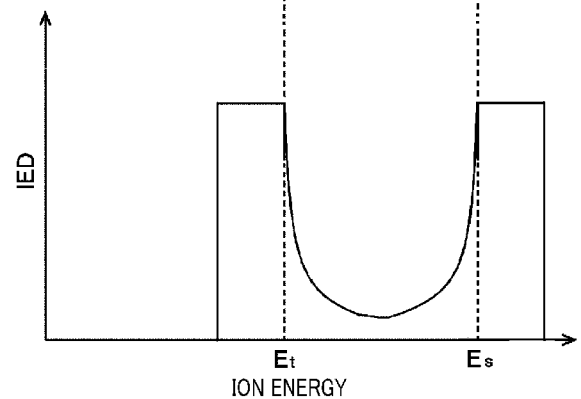

In view of the etching yield/ion energy characteristics of the oxide film and the organic film (mask) in the HARC process, as depicted in FIG. 14B, it can be seen that it is desirable to have a concave-shaped IED characteristic having a peak at a first energy band which is in the vicinity of the threshold value $E_t$ and lower than the threshold value $E_t$ and having a peak at a second energy band which is in the vicinity of the certain value $E_s$ and higher than the certain value $E_s$.

That is, ions are distributed concentrically at the first energy band, so that high selectivity can be obtained. Further, ions are distributed concentrically at the second energy band, so that the necking 100 can be efficiently avoided or prevented.

If the ions are concentrated at an intermediate energy band between the first energy band and the second energy band, selectivity may not be increased and the necking may not be avoided. Accordingly, fewer ions need to be distributed in this intermediate energy band.

Figure 16:
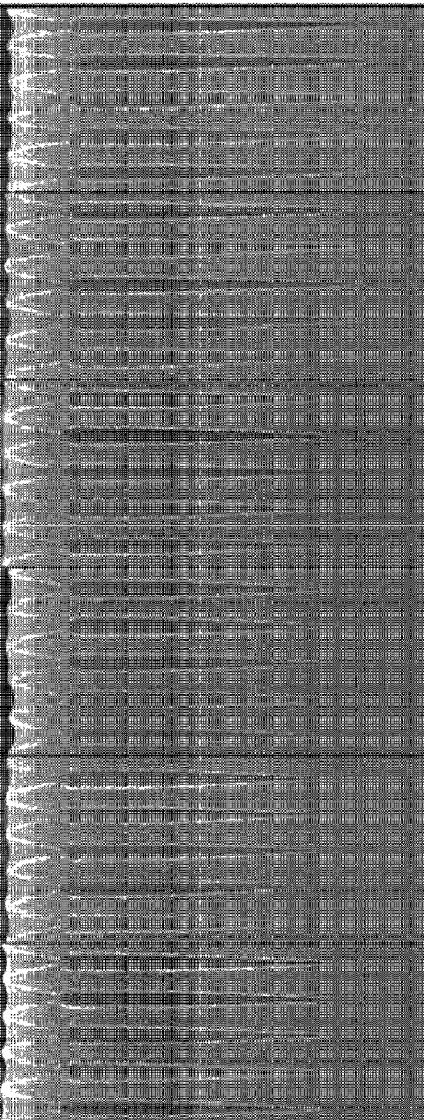
FIG. 16 shows cross-sectional shapes of a pattern and characteristic data obtained in a HARC process performed by a dual frequency RF bias method.

The present inventors have conducted an experiment of the HARC process by the plasma etching apparatus of the present embodiment while varying a power ratio of the first high frequency power $RF_{L1}$ (0.8 MHz) and the second high frequency power $RF_{L2}$ (13 MHz) and comparing the relevant etching characteristics. Experiment results as shown in FIGS. 16 and 17 are obtained. In this case, main etching conditions are as follows:

Diameter of wafer: 300 mm
Etching gas: $C_4F_6O_2$=60/200/60 sccm
Internal Pressure of chamber: 20 mTorr
Temperature: upper electrode/sidewall of chamber/lower electrode=60/60/20r
High frequency power:
 high frequency power for generating plasma (60 MHz)=1000 W
 high frequency power for attracting ions (13 MHz/0.8 MHz)=4500/0 W, 4000/500 W, 3000/1500 W, 2000/2500 W, 1000/3500 W, 0/4500 W (six examples)
DC voltage: $V_{DC}$=−300 V
Etching time: 2 minutes In this experiment, a total power of the first high frequency power $RF_{L1}$ (0.8 MHz) and the second high frequency power $RF_{L2}$ (13 MHz) for attracting ions has been fixed (at about 4500 W). Further, a power ratio as a parameter has been selected from six examples from 4500/0 W to 0/4500 W.

As desirable etching characteristics in the HARC process, an etching rate of the $SiO_2$ film needs to be high, selectivity of the mask needs to be high, a difference between a necking CD and a bowing CD needs to be small, and an inclined angle of the sidewall of the mask needs to be high. From this point of view, it can be seen that when the first high frequency power $RF_{L1}$ and the second high frequency power $RF_{L2}$ are set to be about 1000 W and about 3500 W, respectively, excellent etching characteristics have been achieved as a whole. In this case, a power ratio of the both high frequency powers $RF_{L1}$ and $RF_{L2}$ may be about 3.5:1, and although illustration is omitted, the same concave-shaped IED characteristic as shown in FIG. 8B has been obtained.

As described above, in accordance with the dual frequency bias method of the present disclosure, the trade-off problem in the HARC process can be readily solved. Further, in accordance with the dual frequency bias method of the present disclosure, it may be also possible to solve a trade-off between selectivity and a top CD/a bowing CD/a bottom CD in an etching process for forming a hole and a trade-off between a deposition rate and a seamless shape in plasma CVD.

Furthermore, the concave-shaped IED characteristic achieved by the dual frequency bias method of the present disclosure may have an effect in the HARC process. However, a flat-shaped IED characteristic (FIGS. 6B, 7B and 8C) or a mountain-shaped IED characteristic (FIG. 7C) achieved by the dual frequency bias method of the present disclosure may be a distinctive characteristic. These characteristics cannot be achieved by the conventional single frequency bias method and may optimize a certain process characteristic.

[DC Bias Function in Embodiment]

In the plasma etching apparatus of the present embodiment, by turning ON the switch 84 if necessary, the DC voltage $V_{DC}$ from the variable DC power supply 82 is applied to the upper electrode 48. As described above, by applying to the upper electrode 48 the appropriate DC voltage $V_{DC}$, particularly, the DC voltage $V_{DC}$ having an appropriate magnitude (absolute value), etching resistance of a photoresist film (particularly, an ArF resist film) used as a mask in the plasma etching process can be improved.

That is, if the DC voltage $V_{DC}$ as a negative high voltage (desirably, a negative voltage having an absolute value higher than an absolute value of a self-bias voltage generated on the upper electrode 48 by applying the third high frequency power $RF_H$) is applied to the upper electrode 48 from the variable DC power supply 82, an upper ion sheath formed between the upper electrode 48 and the plasma may become thick. Accordingly, ions in the plasma are accelerated in an electric field of the upper ion sheath, and, thus, ion impact energy when the ions collide with the electrode plate 50 of the upper electrode 48 may be increased. As a result, secondary electrons released from the electrode plate 50 by a γ electric discharge may be increased. The secondary electrons released from the electrode plate 50 may be accelerated in a direction opposite to the direction of the ions in the electric field of the upper ion sheath, and may pass through the plasma PR. Thereafter, the secondary electrons pass through a lower ion sheath and then may be introduced, with a certain high energy, into a resist mask on the surface of the semiconductor wafer W on the susceptor 16. If a polymer of the resist mask absorbs the energy of the electrons, a change in composition or structure and a cross-linking reaction may be made. As a result, a modification (reform) layer may be formed and the etching resistance (plasma resistance) may be increased. As the absolute value of the negative DC voltage $V_{DC}$ applied to the upper electrode 48 is increased, the energy of the electrons introduced into the resist mask can be increased, and the etching resistance in the resist mask can also be increased.

Meanwhile, in the plasma etching apparatus of the present embodiment, as described above, by applying to the susceptor 16 the first high frequency power $RF_{L1}$ and the second high frequency power $RF_{L2}$ each having a different frequency as RF bias powers and by controlling the total power and/or the power ratio of these high frequency powers, in the ion energy distribution (IED) of the ions incident onto the surface of the semiconductor wafer W on the susceptor 16, the width of the energy band, the distribution shape and the total amount of ion incident energy can be controlled in various manners. In particular, if the first high frequency power $RF_{L1}$ and the second high frequency power $RF_{L2}$ are appropriately selected and combined with each other, the number of incident ions at the intermediate energy band in the ion energy distribution (IED) may be rapidly increased. Accordingly, the total amount of ion incident energy can be increased. However, if the total amount of ion incident energy is increased, the resist mask may be damaged, so that a surface of the resist mask may become rough. Further, uneven deformation or zigzag-shaped deformation of so-called LER (Line Edge Roughness) or LWR (Line Width Roughness) may easily occur.

Therefore, in the present embodiment, the control unit 88 may calculate (estimate roughly) the total amount of ion incident energy based on the total power and the power ratio of the first high frequency power $RF_{L1}$ and the second high frequency power $RF_{L2}$. If the total amount of ion incident energy is large, the control unit 88 may increase, through the DC controller 83, the absolute value of the negative DC voltage $V_{DC}$ applied to the upper electrode 48 so as to improve the etching resistance of the resist mask. However, if the total amount of ion incident energy is small, it is preferable to control the absolute value of the negative DC voltage $V_{DC}$ applied to the upper electrode 48 to be small for the reason that needs for improving the etching resistance of the resist mask are decreased and for the following reason.

That is, in the plasma etching apparatus of the present embodiment, by a high frequency discharge of the etching gas, a fluorocarbon gas ($C_xF_y$) is dissociated and reactant species such as F atoms or $CF_3$ are produced. These reactant species react with a process target film on the surface of the semiconductor wafer W, so that a volatile product (for example, $SiF_4$) is produced and a polymer film (for example, $(CF_2)_n$) serving as a deposition film is also produced. If the electrode plate 50 of the upper electrode 48 is made of a conductive material containing Si, the same reaction may occur on a surface of the electrode plate 50 as well as the surface of the semiconductor wafer W, and, thus, the reactant species may be consumed on the both surfaces. At this time, if the negative DC voltage $V_{DC}$ ($\leq 0$ V) is applied to the upper electrode 48, an etching reaction (i.e. consumption of the reactant species) on the surface of the electrode plate 50 may be accelerated by means of an ion-assist effect and a large amount of C-rich CFx may be produced. As a result, an etching rate on the surface of the semiconductor wafer W can be decreased and the deposition may be increased. As the absolute value of the negative DC voltage $V_{DC}$ is increased, the ion-assist effect on the surface of the electrode plate 50 may be increased. Accordingly, based on the above-described reaction, the etching rate on the surface of the semiconductor wafer W can be further decreased and the deposition can be further increased. These decrease of the etching rate and the increase of the deposition may not be desirable if the total amount of energy of the ions incident onto the surface of the semiconductor wafer W on the susceptor 16 is small. Therefore, in this case, the control unit 88 controls, through the DC controller 83, the absolute value of the negative DC voltage $V_{DC}$ applied to the upper electrode 48 to be relatively low.

Another Embodiment or Modification Example

Figure 18:
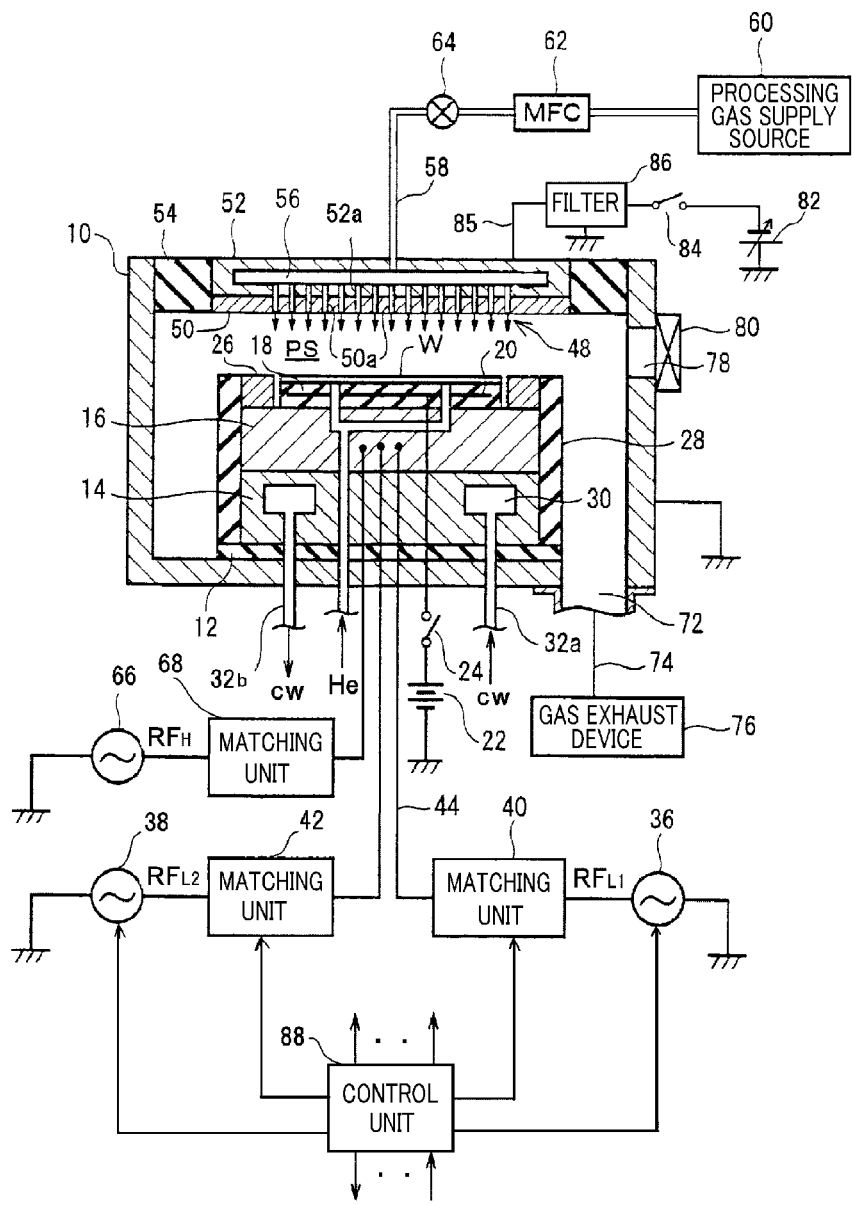
FIG. 18 is a longitudinal cross-sectional view showing a configuration of a plasma processing apparatus in accordance with another embodiment.
Figure 19A:
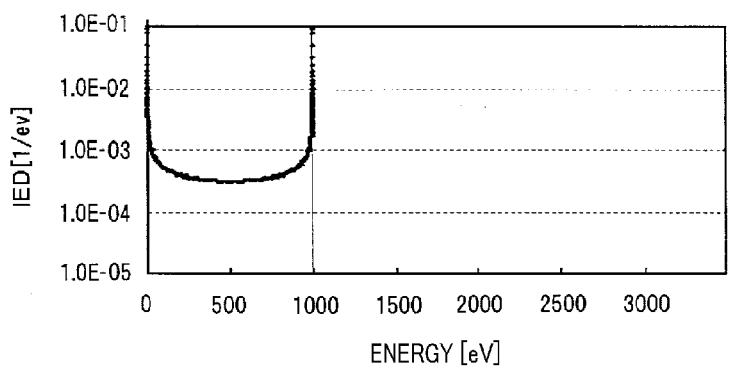
FIG. 19A shows an ion energy distribution obtained by setting a RF power to be low in a conventional signal frequency RF bias method using a relatively low frequency.
Figure 19B:
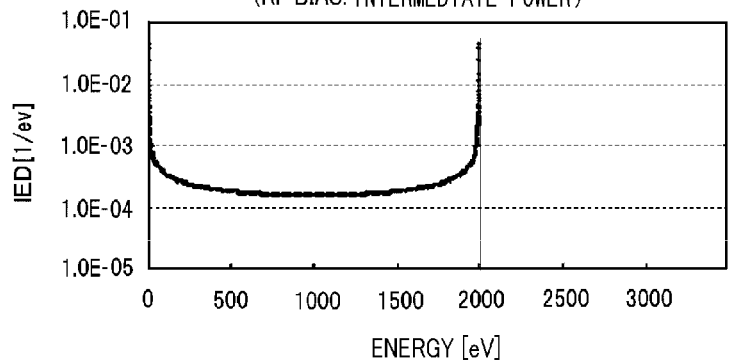
FIG. 19B shows an ion energy distribution obtained by setting a RF power to be intermediate level in a conventional signal frequency RF bias method using a relatively low frequency.
Figure 19C:
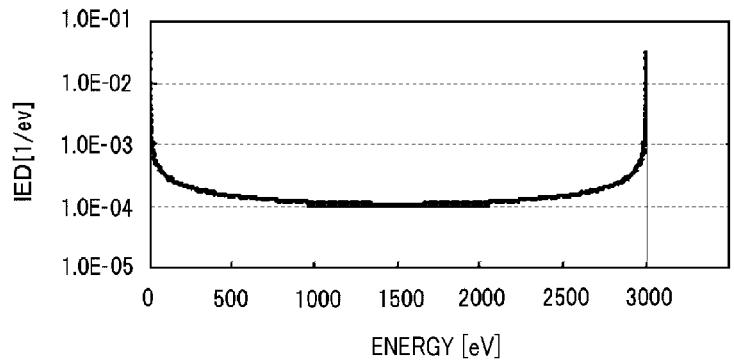
FIG. 19C shows an ion energy distribution obtained by setting a RF power to be high in a conventional signal frequency RF bias method using a relatively low frequency.
Figure 20A:
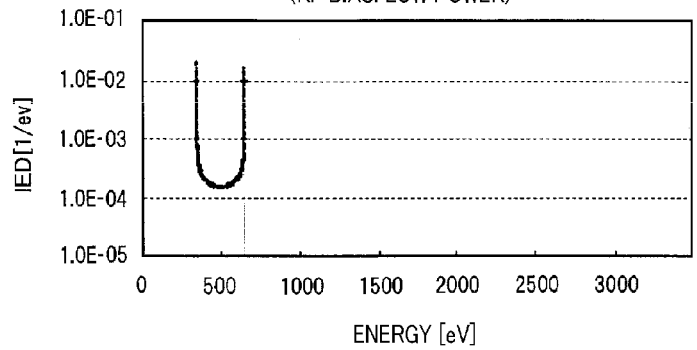
FIG. 20A shows an ion energy distribution obtained by setting a RF power to be low in a conventional signal frequency RF bias method using a relatively high frequency.
Figure 20B:
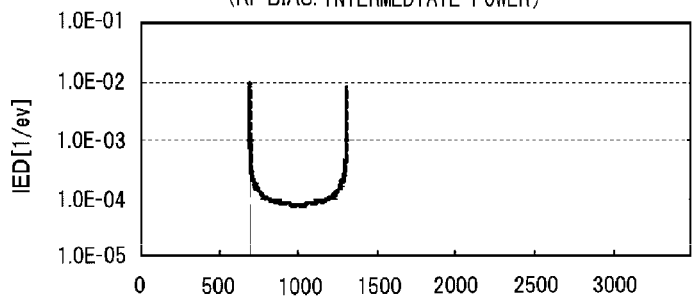
FIG. 20B shows an ion energy distribution obtained by setting a RF power to be intermediate level in a conventional signal frequency RF bias method using a relatively high frequency.
Figure 20C:
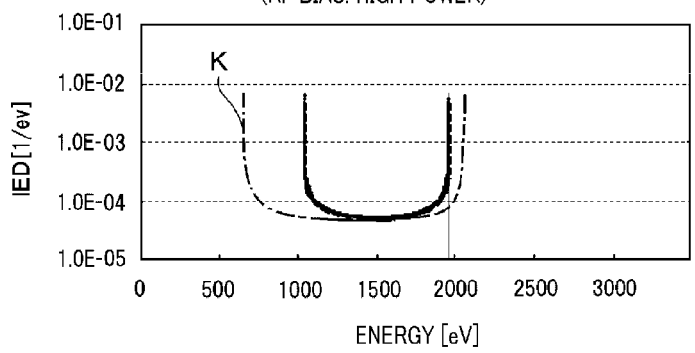
FIG. 20C shows an ion energy distribution obtained by setting a RF power to be high in a conventional signal frequency RF bias method using a relatively high frequency.

In the above-described embodiment, the third high frequency power $RF_H$ for generating plasma output from the third high frequency power supply 66 has been applied to the upper electrode 48. As another embodiment, as depicted in FIG. 18, the third high frequency power supply 66 and the matching unit 68 may be electrically connected to the susceptor (lower electrode) 16 and the third high frequency power $RF_H$ for generating plasma may be applied to the susceptor 16.

The above-described embodiment is related to a capacitively coupled plasma processing apparatus in which plasma may be generated by high frequency discharge between parallel plate electrodes in a chamber. However, the present disclosure may be applied to an inductively coupled plasma etching apparatus in which plasma may be generated under an inductive electromagnetic field of a high frequency power by arranging an antenna on an upper surface of a chamber or around the chamber. Further, the present disclosure may be applied to a microwave plasma processing apparatus in which plasma may be generated by using a power of microwave.

The present disclosure is not limited to a plasma etching apparatus and can be applied to other plasma processing apparatus for plasma CVD, plasma oxidation, plasma nitrification, sputtering or the like. Further, the target substrate of the present disclosure is not limited to a semiconductor wafer and may include various substrates for a flat panel display, an EL device or a solar cell, or a photomask, a CD substrate, or a print substrate.

What is claimed is:

1. A plasma processing method comprising:
   mounting a target substrate having thereon an oxide film and an organic film on a first electrode positioned within an evacuable processing chamber;
   generating plasma by exciting a processing gas within the processing chamber;
   applying to the first electrode a first high frequency power and a second high frequency power each having a different frequency in order to attract ions from the plasma toward the substrate; and
   etching the oxide film using the organic film as a mask to form a hole within the oxide film by the plasma,
   wherein when etching the oxide film, a minimum energy and a maximum energy of the ions incident onto the substrate are controlled independently of each other such that ion energy of the ions are concentrated at a first energy band and a second energy band respectively,
   the first energy band is lower than a first energy value at which the oxide film is etched while the organic film is not etched, and
   the second energy band is higher than a second energy value at which an etching yield at an inclined surface of the hole is higher than an etching yield of an upper surface of the organic film.

2. The plasma processing method of claim 1,
   wherein
   a total power of the first and second high frequency powers is controlled to adjust a width of energy distribution of the ions incident onto the substrate.

3. The plasma processing method of claim 2,
   wherein
   a power ratio of the first and second frequency powers is controlled to adjust the width of the energy distribution of the ions incident onto the substrate.

4. The plasma processing method of claim 3,
   wherein a frequency of the first high frequency power is in a range of from about 100 kHz to about 6 MHz, and a frequency of the second high frequency power is in a range of from about 6 MHz to about 40 MHz.

5. The plasma processing method of claim 1,
   wherein a magnitude of the second high frequency power is adjusted in order to control the minimum energy of the ions incident onto the substrate.

6. The plasma processing method of claim 5,
   wherein a total power of the first and second high frequency powers is adjusted in order to control the maximum energy of the ions incident onto the substrate.

7. The plasma processing method of claim 1,
   wherein a second electrode is provided to face the first electrode in parallel with each other at a distance therebetween, and a third high frequency power for electrically discharging the processing gas is applied to the first electrode or the second electrode.

8. The plasma processing method of claim 7,
   wherein a frequency of the third high frequency power is in a range of from about 27 MHz to about 300 MHz.

9. The plasma processing method of claim 7,
   wherein a negative DC voltage is applied to the second electrode and an absolute value of the negative DC voltage is controlled depending on a total power and a power ratio of the first and second high frequency powers.

10. The plasma processing method of claim 9,
    wherein a total amount of energy of the ions incident onto the substrate is calculated based on the total power and the power ratio of the first and second high frequency powers, and the absolute value of the negative DC voltage is increased as much as the total amount of energy is increased and the absolute value of the negative DC voltage is decreased as much as the total amount of energy is decreased.

* * * * *